United States Patent
Fukada et al.

(10) Patent No.: US 11,424,147 B2
(45) Date of Patent: Aug. 23, 2022

(54) DEPOSITION APPARATUS HAVING PARTICULAR ARRANGEMENT OF RAW MATERIAL SUPPLY PORT, PARTITION PLATE, AND OPENING FOR MEASURING A TEMPERATURE

(71) Applicant: SHOWA DENKO K.K., Tokyo (JP)

(72) Inventors: Keisuke Fukada, Chichibu (JP); Naoto Ishibashi, Chichibu (JP); Hironori Atsumi, Chichibu (JP)

(73) Assignee: SHOWA DENKO K.K., Tokyo (JP)

( * ) Notice: Subject to any disclaimer, the term of this patent is extended or adjusted under 35 U.S.C. 154(b) by 117 days.

(21) Appl. No.: 16/621,899

(22) PCT Filed: May 9, 2018

(86) PCT No.: PCT/JP2018/017937
§ 371 (c)(1),
(2) Date: Dec. 12, 2019

(87) PCT Pub. No.: WO2018/235442
PCT Pub. Date: Dec. 27, 2018

(65) Prior Publication Data
US 2020/0118849 A1 Apr. 16, 2020

(30) Foreign Application Priority Data
Jun. 23, 2017 (JP) .............................. JP2017-123226

(51) Int. Cl.
*C30B 35/00* (2006.01)
*H01L 21/67* (2006.01)
(Continued)

(52) U.S. Cl.
CPC ...... *H01L 21/67248* (2013.01); *C23C 16/325* (2013.01); *G01J 5/0007* (2013.01)

(58) Field of Classification Search
CPC ......... C30B 25/00; C30B 25/08; C30B 25/10; C30B 25/14; C30B 29/00; C30B 29/10;
(Continued)

(56) References Cited

U.S. PATENT DOCUMENTS

| | | | | |
|---|---|---|---|---|
| 5,444,217 A | * | 8/1995 | Moore | ................ C23C 16/4404 219/405 |
| 5,871,586 A | * | 2/1999 | Crawley | ................. C30B 25/14 118/715 |

(Continued)

FOREIGN PATENT DOCUMENTS

| | | |
|---|---|---|
| JP | 04-364719 A | 12/1992 |
| JP | 08-236450 A | 9/1996 |

(Continued)

OTHER PUBLICATIONS

International Search Report of PCT/JP2018/017937 dated Jul. 3, 2018.

*Primary Examiner* — Kenneth A Bratland, Jr.
(74) *Attorney, Agent, or Firm* — Sughrue Mion, PLLC (57) ABSTRACT

According to an aspect of the present invention, there is provided a deposition apparatus including: a reaction space which is a reaction chamber; a front chamber for deposition; a raw material supply port that is configured to supply a raw material to the reaction space; an opening for measuring a temperature of a wafer mounted on a wafer mounting surface of a mounting stage disposed in the reaction space; and a partition plate that partitions the reaction space and the front chamber for deposition, in which the raw material supply port is positioned on the same plane as the partition plate or on the reaction space side from the partition plate, and the opening is positioned in the front chamber for deposition side from the partition plate.

14 Claims, 6 Drawing Sheets

(51) Int. Cl.
*C23C 16/32* (2006.01)
*G01J 5/00* (2022.01)

(58) Field of Classification Search
CPC ....... C30B 29/36; C30B 35/00; C30B 35/002; C30B 35/007; H01L 21/67248; G01J 5/0007; C23C 16/22; C23C 16/30; C23C 16/32; C23C 16/325; C23C 16/455; C23C 16/45502; C23C 16/45519
USPC ..... 117/84–86, 88, 200–201, 204, 937, 951; 118/715, 726, 728
See application file for complete search history.

(56) References Cited

U.S. PATENT DOCUMENTS

| | | | |
|---|---|---|---|
| 2010/0143579 A1 | 6/2010 | Narahara | |
| 2011/0265710 A1 | 11/2011 | Suzuki et al. | |
| 2012/0118225 A1* | 5/2012 | Hsu | C30B 25/10 117/86 |

FOREIGN PATENT DOCUMENTS

| | | |
|---|---|---|
| JP | 2001-081569 A | 3/2001 |
| JP | 2007-043022 A | 2/2007 |
| JP | 2008-108983 A | 5/2008 |
| JP | 2010-141060 A | 6/2010 |
| JP | 2011-146537 A | 7/2011 |
| JP | 2011-231388 A | 11/2011 |
| JP | 2012-015378 A | 1/2012 |
| JP | 2012-018985 A | 1/2012 |
| JP | 2013-251479 A | 12/2013 |
| JP | 5646207 B2 | 12/2014 |

* cited by examiner

DEPOSITION APPARATUS HAVING PARTICULAR ARRANGEMENT OF RAW MATERIAL SUPPLY PORT, PARTITION PLATE, AND OPENING FOR MEASURING A TEMPERATURE

TECHNICAL FIELD

The present invention relates to a deposition apparatus.

This application is a National Stage of International Application No. PCT/JP2018/017937, filed May 9, 2018, claiming priority based on Japanese Patent Application No. 2017-123226, filed on Jun. 23, 2017, the content of which is incorporated herein by reference.

BACKGROUND ART

Silicon carbide (SiC) has properties that a dielectric breakdown electric field is one digit larger, a band gap is three times larger, and thermal conductivity is three times higher, than those of silicon (Si). Therefore, the silicon carbide (SiC) is expected to be applied to a power device, a high frequency device, a high temperature operation device, and the like.

Therefore, in recent years, SiC epitaxial wafer is used for the above semiconductor devices.

In the SiC epitaxial wafer, a SiC single crystal substrate (hereinafter, also referred to as a wafer in some cases) processed from a SiC bulk single crystal produced by a sublimation method or the like is used as a substrate for forming a SiC epitaxial film. In usual, the wafer is manufactured by growing a SiC epitaxial film serving as an active area of a SiC semiconductor device, on the substrate, by chemical vapor deposition (CVD).

In a vapor phase growth method used for an epitaxial growth technique, a reaction space in which a wafer that is an object of film deposition is disposed is maintained at normal pressure or reduced pressure. When a reaction gas is supplied into the reaction space while heating the wafer, a reactive gas reacts on a surface of the wafer, and a vapor phase growth film is deposited on the wafer.

A CVD processing apparatus is used to form various thin films. For example, thin films such as Si, SiC, and groups III-IV compounds can be formed. In a deposition apparatus, a heater is heated during vapor phase film deposition and a temperature of a wafer is set to be a high temperature state. For example, it is known that a temperature of approximately 600° C. is necessary for growing a Si thin film, and a temperature of approximately 1200° C. or higher is necessary for growing a SiC thin film. 4H-SiC used in an electronic device requires particularly high temperature and is generally heated to approximately 1500° C. or higher.

In order to manufacture a thick epitaxial wafer with a high yield, it is necessary to improve a film deposition rate by bringing a new reaction gas into contact with a surface of a uniformly heated wafer one after another. For example, as described in Patent Document 1, in a deposition apparatus of the related art, epitaxial growth is performed while rotating a wafer at high speed.

The surface temperature of a wafer is measured with a radiation pyrometer in many cases. An output of a heater is controlled based on a measurement result of the temperature, and a temperature inside a growth space is adjusted to a target value. For example, Patent Document 2 describes that a tubular member that covers an optical path of emitted light is used between a wafer and a radiation pyrometer in order to accurately measure a temperature with the radiation pyrometer.

In a SiC chemical vapor phase growth apparatus for film deposition of SiC, since a temperature inside a furnace becomes high, a source gas is likely to be decomposed, and deposits are easily generated inside the furnace. As in a deposition apparatus described in Patent Document 2, in a case where the tubular member that covers the optical path of the radiation pyrometer protrudes from a tip of a raw material supply port, deposits adhere to a tip of the tubular member. In a case where deposits adhere to a tip of a pipe that covers the optical path of the radiation pyrometer, the optical path is blocked, and an actual temperature of the surface of the wafer during film deposition may deviate from a temperature indicated by the radiation pyrometer (temperature deviation occurs) in some cases. As described above, there is an appropriate range for a substrate temperature in a film deposition step, and a temperature deviation from the range can cause crystal defects, deterioration of properties of an obtained film, such as film thickness, and a decrease in yield.

CITATION LIST

Patent Literature

Patent Document 1: Japanese Unexamined Patent Application, First Publication No. 2008-108983
Patent Document 2: Japanese Patent No. 5646207

DISCLOSURE OF INVENTION

Technical Problem

As a result of intensive studies, the present inventors found that a disposition of a raw material supply port for introducing a source gas into a reaction space and an opening (hereinafter referred to as a pyrometer port) for measuring the temperature of a wafer placed in the reaction space affects adhesion of deposits to a tip of a pipe.

The present invention has been made in view of the above problems. In a deposition apparatus according to an aspect of the present invention, a pyrometer port and a raw material supply port are disposed in different spaces with a partition plate therebetween, and the pyrometer port is disposed in a position farther away from a wafer mounting surface in a reaction space than the raw material supply port. Accordingly, it is possible to prevent deposits from a source gas from adhering to the pyrometer port and prevent an optical path of a radiation pyrometer from being blocked.

That is, an object is to provide a deposition apparatus capable of accurately measuring and controlling a wafer temperature.

Solution to Problem

As a result of intensive studies, the present inventors found that when a pyrometer port and a raw material supply port are disposed in different spaces with a partition plate therebetween, and the pyrometer port is disposed in a position farther away from a wafer mounting surface in a reaction space than the raw material supply port, the problems can be solved, and completed the invention.

That is, the present invention provides means as follows, in order to solve the problems.

(1) According to a first aspect of the present invention, there is a provided a deposition apparatus including: a reaction space which is a reaction chamber; a front chamber for deposition; a raw material supply port that is configured to supply a raw material to the reaction space; an opening for measuring a temperature of a wafer mounted on a wafer mounting surface of a mounting stage disposed in the reaction space; and a partition plate that partitions the reaction space and the front chamber for deposition, in which the raw material supply port is positioned on the same plane as the partition plate or on the reaction space side from the partition plate, and the opening is positioned on the front chamber for deposition side from the partition plate.

(2) The deposition apparatus according to (1) may have a configuration in which the opening is one end of a pipe for a pyrometer on the reaction space side.

(3) The deposition apparatus according to (1) or (2) may have a configuration in which, in a vertical direction from the opening to the wafer mounting surface, a distance between the opening and a surface of the partition plate on the reaction space side is 20% or more of a diameter of the opening.

(4) The deposition apparatus according to any one of (1) to (3) may have a configuration in which the front chamber for deposition is separated into a first area to which a source gas is supplied and a second area in which the opening is present.

(5) The deposition apparatus according to any one of (1) to (4) may have a configuration further including a purge gas supply port between the opening and the raw material supply port, in which a flow direction of a purge gas which is supplied from the purge gas supply port to the reaction space intersects a line connecting the opening and the raw material supply port.

(6) The deposition apparatus according to any one of aspects (1) to (5) may have a configuration further including a purge gas supply element for supplying a purge gas from the opening to the reaction space.

(7) The deposition apparatus according to any one of (1) to (6) may have a configuration in which the raw material supply port is one end of a raw material supply pipe, and a source gas is separated from other spaces up to the raw material supply port.

(8) The deposition apparatus according to any one of (1) to (7) preferably includes a radiation pyrometer for measuring a temperature of a wafer.

(9) The deposition apparatus according to any one of (1) to (8) preferably further includes a raw material supply pipe, in which the raw material supply port is preferably provided at a distal end of the raw material supply pipe.

(10) In the deposition apparatus according to any one of (1) to (9), the front chamber for deposition preferably includes a first area to which a source gas is supplied and a second area inside of which a pyrometer port is provided, which are divided by a front chamber partition plate, and the raw material supply port is preferably provided in the partition plate that partitions the first area and the front chamber for deposition.

(11) The deposition apparatus according to any one of (1) to (10) preferably further includes a pipe for a pyrometer, in which the opening for measuring the temperature of the wafer is provided at a distal end of the pipe for a pyrometer.

(12) In the deposition apparatus according to any one of (1) to (11), it is preferable that a source gas as a raw material is supplied to the wafer to perform film deposition.

Advantageous Effects of Invention

In the deposition apparatus according to the first aspect of the present invention, a pyrometer port and a raw material supply port are disposed in different spaces with a partition plate therebetween. In addition, the pyrometer port is disposed in a position farther away from a wafer mounting surface in a reaction space than the raw material supply port. Therefore, a source gas flowing into the reaction space from the raw material supply port is limited from reaching the pyrometer port. That is, when the deposition apparatus is used, deposits are limited from adhering to the pyrometer port, and an optical path of a radiation pyrometer can be prevented from being blocked.

The deposition apparatus of the present invention can include a configuration in which the pyrometer port is one end of a pipe for a pyrometer on the reaction space side. When the optical path is covered with a pipe for a pyrometer up to the pyrometer port, the optical path can be easily separated from other spaces, and the optical path of the radiation pyrometer can be more effectively prevented from being blocked.

The deposition apparatus of the present invention can have a configuration in which, in a vertical direction from the pyrometer port to the wafer mounting surface, a distance between the pyrometer port and a surface of the partition plate on the reaction space side is 20% or more of a diameter of the pyrometer port. When the distance between the pyrometer port and the surface of the partition plate on the reaction space side is equal to or more than the range, the source gas reaching the pyrometer port can further be limited.

The deposition apparatus of the present invention can have a configuration in which the front chamber for deposition is separated into a first area to which a source gas is supplied and a second area in which the pyrometer port is present.

When separating an area in which the source gas flows from an area in which the pyrometer port is present, the source gas can further be limited from reaching the pyrometer port.

The deposition apparatus of the present invention can have a configuration further including a purge gas supply port between the pyrometer port and the raw material supply port, in which a flow direction of a purge gas which is supplied from the purge gas supply port to a reaction space intersects a line connecting the pyrometer port and the raw material supply port.

When the flow direction of the purge gas intersects the line connecting the pyrometer port and the raw material supply port, the source gas supplied from the raw material supply port can be blocked due to the purge gas from reaching the pyrometer port.

Accordingly, the source gas can be more effectively prevented from reaching the pyrometer port.

The deposition apparatus of the present invention can further include a purge gas supply element which supplies a purge gas from the pyrometer port to the reaction space.

When supplying the purge gas from the pyrometer port to the reaction space, even if the source gas reaches around the pyrometer port, the source gas can be moved away from the pyrometer port by the flow of the purge gas. That is, the optical path of the radiation pyrometer can be more effectively prevented from being blocked.

The deposition apparatus of the present invention can have a configuration in which the raw material supply port is one end of a raw material supply pipe, and the source gas is separated from other spaces up to the raw material supply port.

When the source gas is transported by the pipe up to the raw material supply port, the source gas can be easily separated from other spaces, and the source gas can be prevented from reaching the pyrometer port.

In a case of using the raw material supply pipe, a structure in a furnace is complicated in many cases and it is difficult to provide a cooling mechanism. Therefore, a temperature of the raw material supply port is likely to rise, and the source gas is likely to decompose near the raw material supply port. On the other hand, as in Patent Documents 1 and 2, in a case where the raw material supply unit is in a shape of a shower plate, members in the furnace are planar, and it is easy to provide a cooling mechanism such as water cooling.

In other words, deposits are more likely to adhere to the raw material supply port in a case of using the raw material supply pipe than in a case of using a shower plate. Accordingly, the present invention is particularly useful in a case of using the raw material supply pipe. The present invention may be a device not using the shower plate.

BEST MODE FOR CARRYING OUT THE INVENTION

Hereinafter, preferred examples of the present invention will be described. Specifically, a deposition apparatus of the preferred embodiments of the present invention will be described in detail, with reference to drawings as appropriate.

In the drawings used in the following description, to make features easier to understand, for the sake of convenience, a feature part may be enlarged and shown in some cases, and a dimension and ratio of each component may be different from an actual one. In addition, in the following description, materials, dimensions, and the like are exemplary examples. The present invention is not limited thereto, and can be performed with appropriate modifications within the scope not changing the gist thereof. That is, the present invention is not limited to only the following examples and addition, omission, substitution, or change in a position, the number, a shape, a material, a configuration, and the like can be made within the scope not departing from the gist of the present invention.

First Embodiment

An example of a deposition apparatus 100 according to a first embodiment will be described with reference to FIG. 1.

The deposition apparatus 100 of the first embodiment includes a furnace body 10, a mounting stage 20, and a raw material supply pipe 50. The mounting stage 20 is positioned in the furnace body 10. In the mounting stage 20, a wafer 30 can be mounted on a wafer mounting surface 21A. An epitaxial film is grown on a surface of the wafer 30 by operating the deposition apparatus 100. A source gas g is introduced to an inside of the deposition apparatus 100 through the raw material supply pipe 50.

Figure 1:
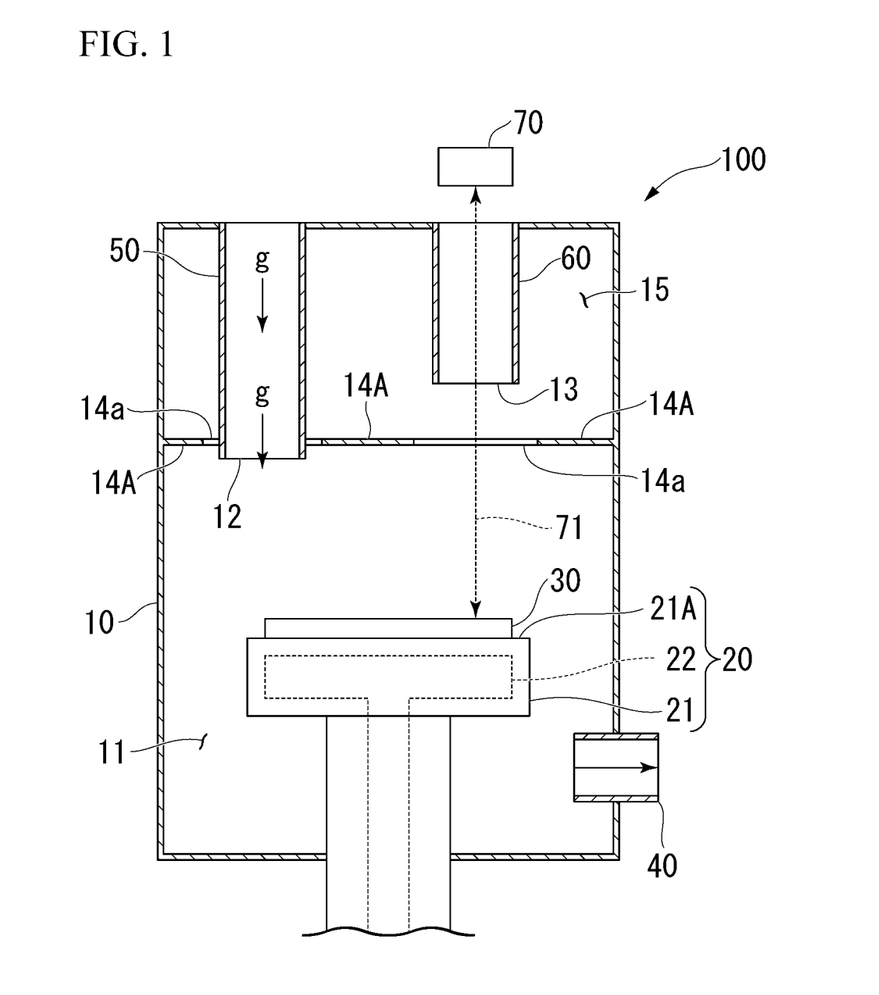
FIG. 1 is a schematic sectional view of a deposition apparatus according to a first embodiment of the present invention.

The furnace body 10 shown in FIG. 1 includes a reaction space 11 and a front chamber for deposition 15 inside. The reaction space 11 and the front chamber for deposition 15 are partitioned by a partition plate 14A.

The reaction space 11 is a space where source gas g is supplied and epitaxial growth is performed.

That is, in the furnace body 10, a space on a wafer mounting surface 21A side from the raw material supply port 12 is the reaction space 11. On the other hand, the front chamber for deposition 15 is an area in which a pipe that introduces a gas reaching the reaction space 11 into the furnace body 10 is disposed and the gas is once stored. The partition plate 14A partitions the reaction space 11 that is heated to a high temperature by radiation from a heater, and a front chamber for deposition 15 that has a generally complicated structure in which gas pipes and the like are disposed. When adopting such a disposition, the partition plate 14A protects the front chamber for deposition 15 as a kind of a heat shielding mechanism. In addition, in a case where the source gas g is supplied to the reaction space 11 after passing through the front chamber for deposition 15 as will be described later, when storing a gas once in the front chamber for deposition 15, even if the gas supplied from a cylinder or the like is pulsating, the amount of gas supplied into the reaction space 11 can be made constant. The same effect is obtained also in a case where a carrier gas rather than the source gas g is used and the carrier gas is supplied to the reaction space 11 via the front chamber for deposition 15. In FIG. 1, the gas supplied to the front chamber for deposition 15 is supplied to the reaction space 11 through a partition plate opening 14a provided in the partition plate 14A. In FIG. 1, as the partition plate opening 14a, there are two parts, a raw material supply opening for passing the raw material supply pipe 50 and a temperature measurement opening (an opening for measuring a temperature of a wafer). Also, in FIG. 1, disposition of the pipe is simplified, and the gas is supplied from an upper opening in FIG. 1, but these are not limited to the configuration.

The raw material supply port 12 is an opening for supplying the source gas g to an inside of the reaction space 11. In FIG. 1, one end of the raw material supply pipe 50 corresponds to the raw material supply port 12.

The raw material supply port 12 is positioned on the same surface as the partition plate 14A or on a reaction space 11 side from the partition plate 14A. That is, the one end of the raw material supply pipe 50 in FIG. 1 is present on the same plane as the partition plate 14A or at a position protruding from the partition plate 14A. Here, being present on the same plane as the partition plate 14A means being present at the same height as a surface of the partition plate 14A on the reaction space 11 side.

A pyrometer port 13 is provided on the furnace body 10. The pyrometer port 13 is an opening provided to guide an optical path 71 from a surface of the wafer 30 to a radiation pyrometer 70 to an outside of the furnace body or an outside of the device. The radiation pyrometer 70 measures a surface temperature of the wafer 30. An output of a heating mechanism 22 is controlled based on an obtained measurement result, and a temperature inside the reaction space 11 is adjusted to a target value. In the present invention, the pyrometer port is disposed so as not to block the optical path 71 from the surface of the wafer 30 to the radiation pyrometer 70. In a case where the radiation pyrometer is installed outside the furnace body, a material that transmits light, such as a seal member using quartz glass, is disposed in a part of the optical path such as a part that passes through a wall of the furnace body, and the furnace body is sealed.

The pyrometer port 13 is positioned on a front chamber for deposition 15 side from the partition plate 14A. That is, the pyrometer port 13 is located in the front chamber for deposition 15. In FIG. 1, the pyrometer port 13 is shown as one end of a pipe 60 for a pyrometer 70. However, the pyrometer port 13 may not be one end of the pipe 60 for a pyrometer 70 but may simply be an opening provided in the furnace body 10. In this case, the opening of the furnace body, as the pyrometer port 13, may be provided on a wall of the furnace body or the front chamber for deposition, located between the surface of the wafer 30 and the radiation pyrometer 70, and a shape that the pipe 60 for a pyrometer 70 protrudes outside of the furnace may be adopted. In addition, the pipe 60 for a pyrometer 70 may be a member that covers the optical path, and any shape or material thereof may be selected. For example, the pipe for a pyrometer may be a cylindrical tubular member, a tubular member other than a cylinder, or a member having a shape of covering the optical path other than tubular such as a plate-shaped.

As described above, the pyrometer port 13 is disposed in a position farther away from the wafer mounting surface 21A, in the front chamber for deposition 15, than the raw material supply port 12. The source gas g flows from the raw material supply port 12 toward wafer 30 mounted on the wafer mounting surface 21A. When the pyrometer port 13 is in a position farther away from the wafer mounting surface 21A than the raw material supply port 12, it is possible to prevent the pyrometer port 13 from intersecting the flow path. Therefore, the source gas g flowing into the reaction space 11 from the raw material supply port 12 is limited from reaching the pyrometer port 13.

Also, the partition plate 14A blocks the source gas g from the reaction space 11 to the front chamber for deposition 15. Therefore, deposits can be prevented from adhering to the pyrometer port 13 which is present on the front chamber for deposition 15 side, and the optical path 71 of radiation pyrometer 70 can be more effectively prevented from being blocked.

That is, when the deposition apparatus 100 of the present embodiment is used, deposits are limited from adhering to the pyrometer port 13, and the optical path 71 of the radiation pyrometer 70 can be prevented from being blocked.

The pyrometer port 13 is preferably in a position away from the surface of the partition plate 14A on the reaction space 11 side, by a distance of 20% or more of the diameter of the pyrometer port 13.

Figure 2:
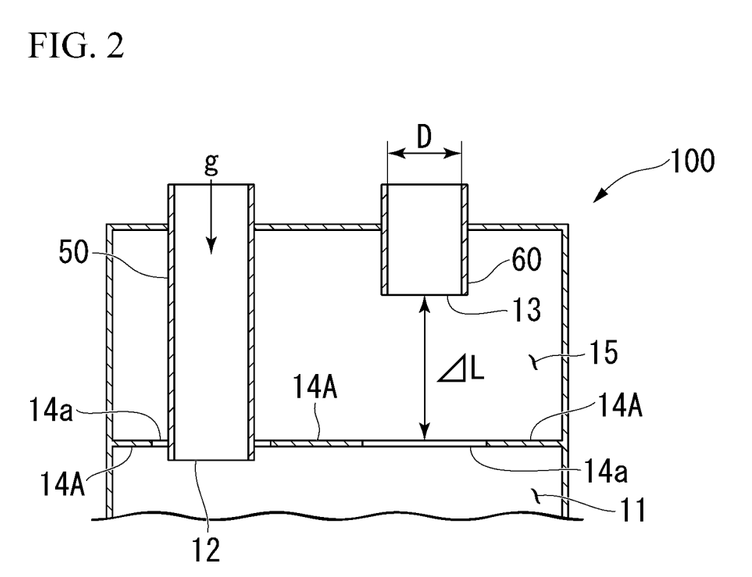
FIG. 2 is a schematic sectional view showing an enlarged main part of the deposition apparatus according to the first embodiment of the present invention, and for sake of simplicity, a lower part of a furnace body is not shown.

FIG. 2 is a view showing an enlarged main part of the deposition apparatus 100 according to the present embodiment. For sake of simplicity, in FIG. 2, a lower part of a furnace body is not shown. FIG. 2 shows a relationship between a distance ΔL between the pyrometer port 13 and the surface of the partition plate 14A on the reaction space 11 side and a diameter D of the pyrometer port 13. Here, the distance ΔL between the pyrometer port 13 and the surface of the partition plate 14A on the reaction space 11 side refers to a distance in a vertical direction from the pyrometer port 13 to the wafer mounting surface 21A. If the distance ΔL is in a range of 20% or more of the diameter D of the pyrometer port 13, the pyrometer port 13 can be sufficiently separated from the partition plate 14A. Since source gas g is blocked by the partition plate 14A, in principle, the source gas g reaches only near the partition plate 14A. In addition, for example, even if the source gas g enters the front chamber for deposition 15 from the partition plate opening 14a, the source gas g hardly reaches the pyrometer port 13. In addition, a predetermined upper limit of the distance ΔL can be selected, and examples thereof include, but are not limited to, 300% or less or 500% or less of the diameter D of the pyrometer port 13.

The partition plate opening 14a is provided in a partition plate 14A. The partition plate opening 14a is provided on the optical path 71 of the radiation pyrometer 70.

The partition plate opening 14a is small as much as the source gas g does not enter the front chamber for deposition and is large enough not to block the optical path. Therefore, it is preferable that the partition plate opening 14a has the same size as the pyrometer port 13. From a viewpoint of preventing deposits from adhering to the partition plate 14A around the partition plate opening 14a, the partition plate opening 14a is preferably provided at a position farther away from the wafer mounting surface 21A than the raw material supply port 12. That is, it is preferable that one end of the raw material supply port 12 protrudes from the partition plate 14A to the reaction space 11 side or is flush with the partition plate 14A. A predetermined distance by which the one end protrudes from the partition plate 14A can be selected. For example, 0% or more or 5% or more of the diameter of the raw material supply port 12 can be set as a preferred example, but there is no limitation thereto. However, when the raw material supply port 12 protrudes too much, a possibility that deposits adhere to the raw material supply port itself increases. For example, the distance by which the one end protrudes from the partition plate 14A is preferably 100% or less or 200% or less of the diameter of the raw material supply port 12 as a preferred example, but is not limited thereto.

In addition, a gas exhaust port 40 is provided in the furnace body 10. The gas exhaust port 40 is disposed below a surface on which the wafer 30 is mounted on the mounting stage 20 in the furnace body 10, and exhausts unreacted gas after passing the wafer 30. In addition, vacuum suction can be performed from the gas exhaust port 40, and an atmospheric pressure inside the furnace body 10 can be adjusted as appropriate.

The raw material supply pipe 50 is a tubular member having a through hole inside. The inside through-hole is a gas introduction path, and the source gas g flows therein. When the source gas g is transported by the raw material supply pipe 50 up to the raw material supply port 12, the source gas g can be easily separated from other spaces. In addition, a purge gas and an impurity doping gas, in addition to source gas g, may be flowed from the raw material supply pipe. An example of one raw material supply pipe 50 is shown in the drawing. However, in the present invention, two or more raw material supply pipes 50 may be provided as needed. The same gas or different types of gas may flow through each pipe. A mixed gas may flow through the pipe.

As the source gas g, a Si-based source gas and a C-based source gas are used. These source gases may be supplied separately into the furnace body 10 or supplied thereto by being mixed.

As the Si-based source gas, for example, silane ($SiH_4$) can be used as a silane-based gas, and chlorine-based Si raw material containing gas having Cl having etching action (chloride-based raw material), such as $SiH_2Cl_2$, $SiHCl_3$, $SiCl_4$, and the like can also be used. In addition, for example, a gas obtained by adding HCl to silane may be used. As the C-based source gas, for example, propane ($C_3H_8$) or the like can be used.

The purge gas is a gas not containing Si or C, and an inert gas (rare gas) such as Ar or He can be used as well as a gas having etching action, containing $H_2$. In addition, in a case of controlling a conductivity type of a SiC epitaxial film laminated on the wafer 30, impurity doping gas can be simultaneously supplied. For example, in a case where the conductivity type is an n-type, $N_2$ can be used, and in a case of p-type, trimethylaluminum (TMA) can be used.

The mounting stage 20 includes a susceptor 21 and the heating mechanism 22. The susceptor 21 is provided with a tubular support shaft extending downward, and the support shaft is rotatable by being connected to a rotation mechanism (not shown). The heating mechanism 22 is configured by a heater or the like facing the surface on which the wafer 30 is mounted, and is installed in the susceptor 21. The heating mechanism 22 is energized from the outside through an inside of the support shaft of the susceptor 21.

As described above, in the deposition apparatus according to the present embodiment, the pyrometer port 13 is positioned at a position farther away from the wafer mounting surface 21A in the reaction space 11, than the raw material supply port 12. Also, the partition plate 14A blocks the source gas g from the reaction space 11 to the front chamber for deposition 15. According to adopting the above configuration, deposits can be prevented from adhering to the pyrometer port 13, and the optical path 71 of the radiation pyrometer 70 can be prevented from being blocked.

Second Embodiment

Figure 3:
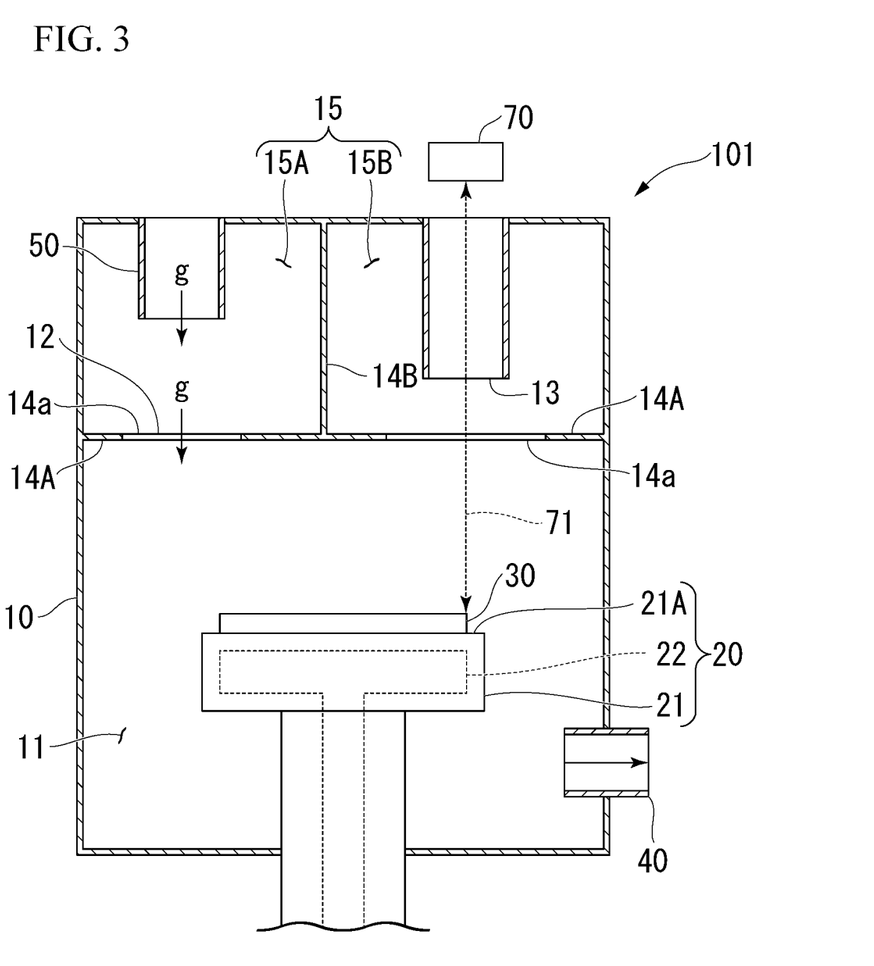
FIG. 3 is a schematic sectional view of a deposition apparatus according to a second embodiment of the present invention.

FIG. 3 is a sectional schematic view of a deposition apparatus according to a second embodiment. A deposition apparatus 101 shown in FIG. 3 is different from the deposition apparatus 100 according to the first embodiment in that a front chamber partition plate 14B is provided. Other configurations are the same as those of the deposition apparatus 100 according to the first embodiment. The same configurations are denoted by the same reference signs.

The front chamber for deposition 15 shown in FIG. 3 includes the front chamber partition plate 14B inside. The front chamber for deposition 15 is separated into a first area 15A and a second area 15B by the front chamber partition plate 14B. The source gas g is supplied to the first area 15A, and the pyrometer port 13 is provided in the second area 15B or in a wall of the second area.

One end of the raw material supply pipe 50 is provided on an inside of the first area 15A. The source gas g is supplied to the first area 15A through the raw material supply pipe 50, and then supplied to the reaction space 11 through the raw material supply port 12. Since an opening for supplying the source gas g to the reaction space 11 is the raw material supply port 12, one end of the raw material supply pipe 50 in FIG. 3 does not correspond to the raw material supply port.

Therefore, one end of the raw material supply pipe 50 may be present at a position farther away from the wafer mounting surface 21A than the pyrometer port 13. The source gas g supplied to the first area 15A is supplied to the reaction space 11 through the raw material supply port 12 leading to the reaction space 11. When including the first area 15A, the source gas supplied from the pipe can be temporarily retained in the first area 15A.

As a result, even in a case where fluctuation occurs in a supply rate of the source gas g, the flow of the source gas g supplied to the reaction space 11 can be made constant.

The first area 15A separated by introducing the front chamber partition plate 14B independently plays a role as an area in which the source gas g flows. On the other hand, the second area 15B independently plays a role as an area inside of which the pyrometer port 13 is provided. That is, according to the deposition apparatus according to the present embodiment, since the source gas g can be separated from the pyrometer port 13 until the source gas g is introduced into the reaction space 11, the source gas g can further be limited from reaching the pyrometer port 13. Therefore, deposits can be prevented from adhering to the pyrometer port 13, and the optical path 71 of the radiation pyrometer 70 can be more effectively prevented from being blocked.

Third Embodiment

Figure 4:
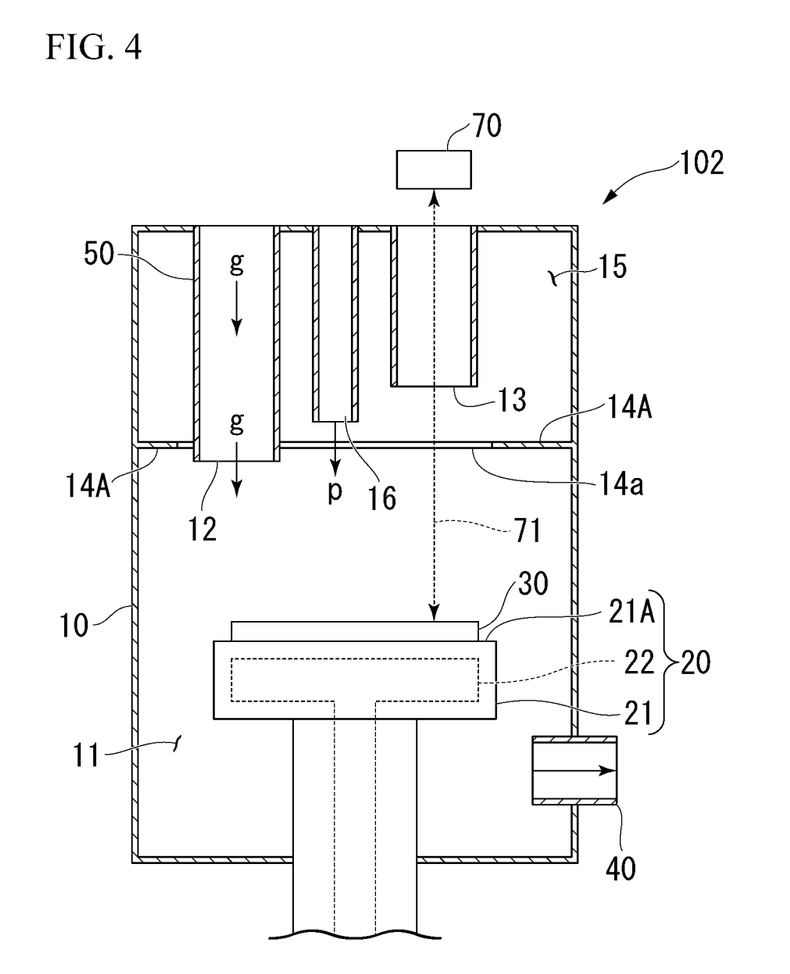
FIG. 4 is a schematic sectional view of a deposition apparatus according to a third embodiment of the present invention.

FIG. 4 is a sectional schematic view of a deposition apparatus according to a third embodiment. A deposition apparatus 102 shown in FIG. 4 is different from the deposition apparatus 100 according to the first embodiment in that a purge gas supply port 16 is provided. Other configurations are approximately the same as those of the deposition apparatus 100 according to the first embodiment, and the same configurations are denoted by the same reference signs.

The purge gas supply port 16 is an opening provided in the furnace body 10. The purge gas p is supplied from the purge gas supply port 16 to an inside of the furnace body 10. The purge gas may be supplied from one or more pipes or the like provided in the furnace body 10, or may be supplied from an opening formed in a wall of the front chamber for deposition. The purge gas supply port 16 is provided such that a flow direction of the purge gas p supplied from the purge gas supply port 16 intersects a line connecting the pyrometer port 13 and the raw material supply port 12. In FIG. 4, the partition plate opening 14a is used for both raw material supply for passing the raw material supply pipe 50 and temperature measurement, and one larger opening is provided for corresponding to the raw material supply pipe 50, the purge gas supply pipe, and the pipe for a pyrometer 70. That is, when viewed from above, the three pipes are observed to fit within the opening. However, if a temperature measurement opening is an opening having a size enough to allow purge gas to pass, there may be provided two partition plate openings 14a that are a raw material supply opening in which the raw material supply pipe 50 passes through and a temperature measurement opening.

The flow direction is a main vector direction of the gas. Here, the flow direction of the purge gas p is the main vector direction of the purge gas p extending from the purge gas supply port 16 to the reaction space, and a direction from the purge gas supply port 16 toward the wafer mounting surface 21A. When the flow direction of the purge gas p intersects the line connecting the pyrometer port 13 and the raw material supply port 12, the purge gas p flows to block between the pyrometer port 13 and the raw material supply port 12. Accordingly, the source gas g can be more effectively prevented from reaching the pyrometer port 13.

As long as at least one supply port satisfies the above condition of the flow direction, it is more preferable that the purge gas supply port 16 is disposed such that one or more purge gas supply ports surround the pyrometer port 13. When supplying the purge gas p around the pyrometer port 13, the raw material can be further prevented from adhering to the pyrometer port 13.

In addition, the purge gas p may flow from the pyrometer port 13. In this case, the purge gas supply element is connected to the pyrometer port 13. As purge gas supply element, well-known supply element can be used. When the purge gas p from the pyrometer port 13 flows, deposits can be further limited from adhering to the pyrometer port 13.

As described above, according to the deposition apparatus 102 according to the present embodiment, the source gas g can be prevented from approaching the pyrometer port 13 by the purge gas p. Therefore, in the deposition apparatus 102 according to the present embodiment, the optical path 71 of the radiation pyrometer 70 can be more effectively prevented from being blocked.

Hereinabove, the preferred embodiments of the present invention have been described in detail, but the present invention is not limited to a specific embodiment, and various modifications and changes can be made within the scope of the present invention described in the claims.

EXAMPLES

Hereinafter, effects of the present invention will be specifically described using Examples. The present invention is not limited to these Examples.

EXAMPLE 1

Figure 5:
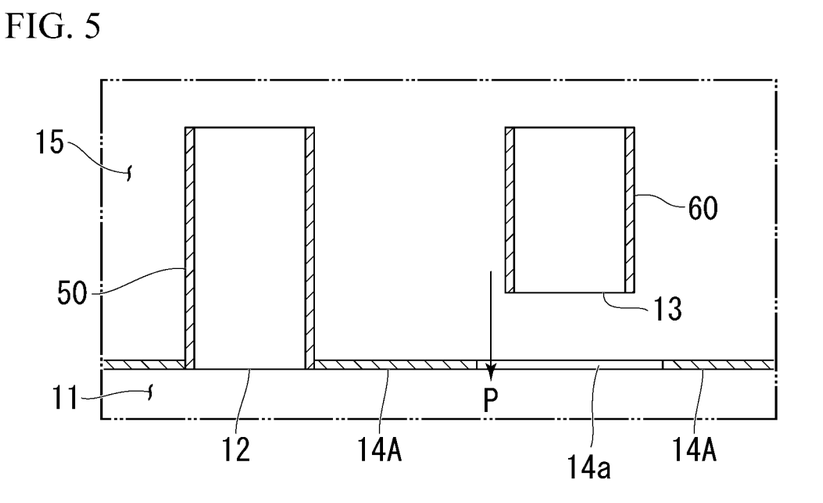
FIG. 5 is a schematic sectional view schematically showing a main part of a deposition apparatus according to Example 1.

FIG. 5 is a sectional schematic view showing an enlarged main part of a deposition apparatus according to Example 1. As shown in FIG. 5, the raw material supply port 12 was provided closer to the wafer mounting surface 21A (not shown) side than the pyrometer port 13. In addition, the partition plate 14A was provided in the furnace body 10, and the reaction space 11 and the front chamber for deposition 15 were separated from each other. The raw material supply port 12 was provided on the same surface as the surface on which the partition plate 14A and the reaction space 11 contacted. The pyrometer port 13 was provided away from the partition plate 14A and inside the front chamber for deposition 15, that is, away from the wafer mounting surface 21A. Furthermore, the pyrometer port 13 was one end of the pipe 60 for a pyrometer. The purge gas was supplied around the pipe 60 for a pyrometer. The purge gas was supplied such that a flow direction of the purge gas p supplied from the purge gas supply port intersected a line connecting the pyrometer port 13 and the raw material supply port 12. As the source gas, trichlorosilane (SiHCl$_3$) and propane (C$_3$H$_8$) were used, and an epitaxial film was grown on a SiC wafer. As the purge gas, hydrogen and argon were used. The distance between the pyrometer port 13 and the partition plate 14A was 34.5% with respect to an outer diameter of the pipe 60 for a pyrometer. An upper part of the pipe is omitted.

Comparative Example 1

Figure 6:
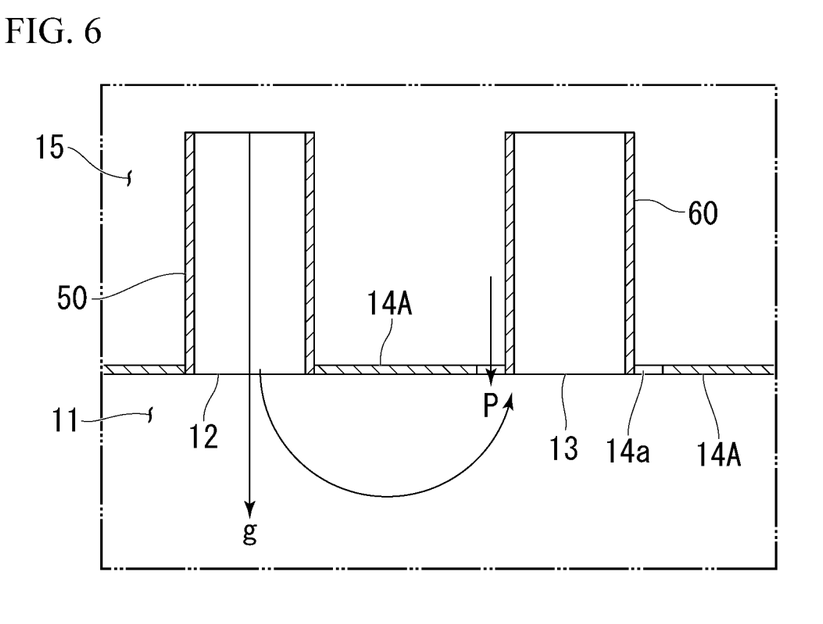
FIG. 6 is a schematic sectional view showing a main part of a deposition apparatus according to Comparative Example 1.

FIG. 6 is a sectional schematic view showing an enlarged main part of a deposition apparatus according to Comparative Example 1. As shown in FIG. 6, Comparative Example 1 is different from Example 1 only in that a position of the pyrometer port 13 is on the same plane as the partition plate 14A. That is, in Comparative Example 1, the pyrometer port 13 and the raw material supply port 12 were in the same plane. Other configurations were the same as those in Example 1, and a SiC epitaxial film was grown.

Figure 7:
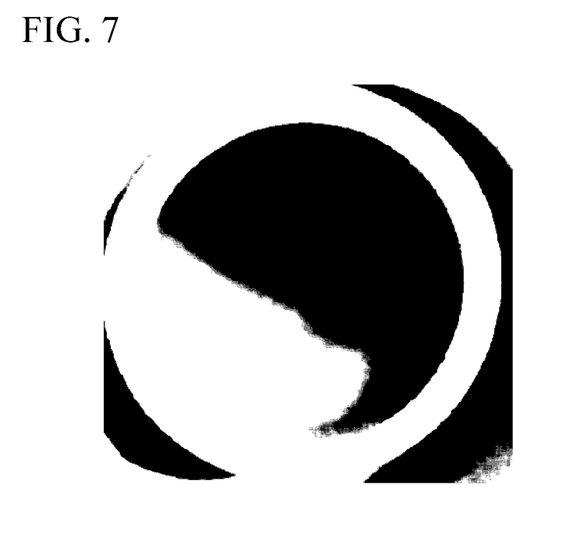
FIG. 7 is a photograph of a pyrometer port in the deposition apparatus of Example 1 taken from inside a furnace body.
Figure 8:
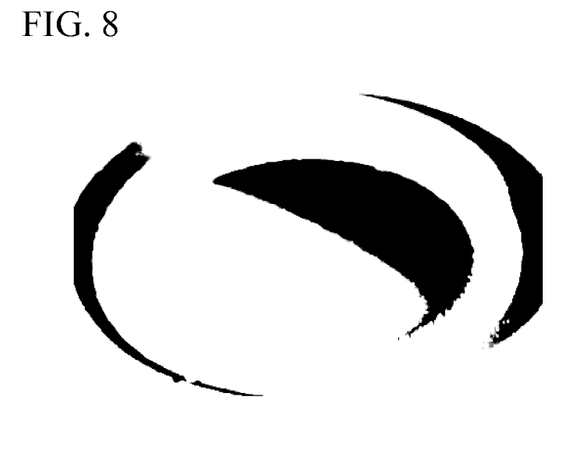
FIG. 8 is a photograph of a pyrometer port in the deposition apparatus of Comparative Example 1 taken from inside a furnace body.

FIG. 7 is a photograph of an end part of the pyrometer port on the reaction space side after an epitaxial film of cumulative 9900 μm was grown under the conditions of Example 1. FIG. 8 is a photograph of an end part of the pyrometer port on the reaction space side after an epitaxial film of cumulative 9600 μm was grown under the conditions of Comparative Example 1. As shown in FIGS. 7 and 8, deposits were not confirmed at the end part of the pyrometer port after performing film deposition under the conditions of Example 1, but deposits were observed at the end part of the pyrometer port after performing the film deposition under the conditions of Comparative Example 1.

INDUSTRIAL APPLICABILITY

The present invention provides a deposition apparatus in which deposits from a source gas can be prevented from adhering to the pyrometer port, an optical path of a radiation pyrometer can be prevented from being blocked, and a substrate temperature can be accurately measured and controlled.

In the deposition apparatus of the present invention, a pyrometer port is disposed in a position farther away from a wafer mounting surface in the reaction space than the raw material supply port. Accordingly, deposits from a source gas are limited from adhering to an introduction pipe. Also, a partition plate blocks the source gas from the reaction space to a front chamber for deposition. Accordingly, it is possible to provide a deposition apparatus capable of accurately measuring and controlling the substrate temperature. For example, the properties of an obtained film such as crystal defects and film thickness can be improved, and the yield can be improved.

REFERENCE SIGNS LIST

100, 101, 102: Deposition apparatus
10: Furnace body
11: Reaction space (Reaction chamber)
12: Raw material supply port
13: Pyrometer port
14A: Partition plate
14a: Partition plate opening
14B: Front chamber partition plate
15: Front chamber for deposition
15A: First area
15B, Second area
16: Purge gas supply port
20: Mounting stage
21: Susceptor
21A: Wafer mounting surface
22: Heating mechanism
30: Wafer
40: Gas exhaust port
50: Raw material supply pipe
60: Pipe for pyrometer
70: Radiation pyrometer
71: Optical path
g: Source gas
p: Purge gas

The invention claimed is:

1. A deposition apparatus comprising:
   a reaction space which is a reaction chamber;
   a front chamber for deposition;
   a raw material supply port that is configured to supply a raw material to the reaction space;
   an opening for measuring a temperature of a wafer mounted on a wafer mounting surface of a mounting stage disposed in the reaction space; and
   a partition plate that partitions the reaction space and the front chamber for deposition,
   wherein the raw material supply port is positioned on the same plane as the partition plate or on the reaction space side from the partition plate,
   the opening is positioned on the front chamber for deposition side from the partition plate, and the opening is one end of a pipe for a pyrometer on the reaction space side, and
   in a vertical direction from the opening to the wafer mounting surface, a distance between the opening and a surface of the partition plate on the reaction space side is 20% or more of a diameter of the opening,
   wherein the deposition apparatus is configured with one opening in the partition plate for supplying raw material to the reaction space, and
   wherein the deposition apparatus does not include a shower plate.

2. The deposition apparatus according to claim 1,
   wherein the front chamber for deposition is separated into a first area to which a source gas is supplied and a second area in which the opening is present.

3. The deposition apparatus according to claim 1, further comprising:
   a purge gas supply port between the opening and the raw material supply port,
   wherein a flow direction of a purge gas which is supplied from the purge gas supply port to the reaction space intersects a line connecting the opening and the raw material supply port.

4. The deposition apparatus according to claim 1, further comprising:
   a purge gas supply element for supplying a purge gas from the opening to the reaction space.

5. The deposition apparatus according to claim 1,
   wherein the raw material supply port is one end of a raw material supply pipe, and
   a source gas is separated from other spaces up to the raw material supply port.

6. The deposition apparatus according to claim 1, further comprising:
   a radiation pyrometer for measuring a temperature of a wafer.

7. The deposition apparatus according to claim 1, further comprising:
   a raw material supply pipe,
   wherein the raw material supply port is provided at a distal end of the raw material supply pipe.

8. The deposition apparatus according to claim 1,
   wherein the front chamber for deposition includes a first area to which a source gas is supplied and a second area inside of which a pyrometer port is provided, which are divided by a front chamber partition plate, and
   the raw material supply port is provided in the partition plate that partitions the first area and the front chamber for deposition.

9. The deposition apparatus according to claim 1, further comprising:
   a pipe for a pyrometer,
   wherein the opening for measuring the temperature of the wafer is provided at a distal end of the pipe for a pyrometer.

10. The deposition apparatus according to claim 1,
    wherein a source gas as a raw material is supplied to the wafer to perform film deposition.

11. The deposition apparatus according to claim 1,
    wherein the pipe for a pyrometer is located in the front chamber for deposition.

12. The deposition apparatus according to claim 1,
    wherein a part of the pipe for a pyrometer protrudes outside of the front chamber.

13. The deposition apparatus according to claim 1,
    wherein the distance between the opening and the surface of the partition plate on the reaction space side is 500% or less of the diameter of the opening.

14. The deposition apparatus according to claim 1,
    wherein the raw material supply port is positioned on the reaction space side from the partition plate.

* * * * *